(12) United States Patent
Yamada et al.

(10) Patent No.: US 8,928,178 B2
(45) Date of Patent: Jan. 6, 2015

(54) ISOLATED OPERATION DETECTION DEVICE

(75) Inventors: Toshiya Yamada, Kobe (JP); Kansuke Fujii, Machida (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 781 days.

(21) Appl. No.: 13/179,518

(22) Filed: Jul. 9, 2011

(65) Prior Publication Data

US 2012/0007436 A1 Jan. 12, 2012

(30) Foreign Application Priority Data

Jul. 9, 2010 (JP) ................................. 2010-156348

(51) Int. Cl.
*H02J 1/00* (2006.01)
*H02J 3/00* (2006.01)
*H02J 3/38* (2006.01)
*G01R 31/02* (2006.01)

(52) U.S. Cl.
CPC ........... *H02J 3/381* (2013.01); *H02J 2003/388* (2013.01); *G01R 31/026* (2013.01)
USPC .......................................................... 307/86

(58) Field of Classification Search
USPC .................... 307/73, 86, 87; 702/58; 323/205
See application file for complete search history.

(56) References Cited

U.S. PATENT DOCUMENTS

| | | | | |
|---|---|---|---|---|
| 6,107,784 | A * | 8/2000 | Nomiya et al. | 323/205 |
| 2003/0165036 | A1* | 9/2003 | Tuladhar | 361/62 |
| 2007/0179724 | A1* | 8/2007 | Mabuchi et al. | 702/60 |
| 2011/0115301 | A1* | 5/2011 | Bhavaraju et al. | 307/86 |

FOREIGN PATENT DOCUMENTS

| | | |
|---|---|---|
| JP | 07-031197 A | 1/1995 |
| JP | 07123595 A | 5/1995 |
| JP | 08-084436 A | 3/1996 |
| JP | 08065898 A | 3/1996 |
| JP | 8-331764 A | 12/1996 |
| JP | 08-331765 A | 12/1996 |
| JP | 3353549 | 9/2002 |

OTHER PUBLICATIONS

Lin Minyao, Gu Juan, Shan Zhujie, Zhang Yiran; "A Practical Hybrid Islanding Detectioo Metbod for Grid-tonaected Pbolovollalc System"; Automation of Electric Power Systems vol. 33 No. 23; De. 10, 2009; 85-89.

* cited by examiner

*Primary Examiner* — Rexford Barnie
*Assistant Examiner* — Rasem Mourad
(74) *Attorney, Agent, or Firm* — Rabin & Berdo, P.C.

(57) ABSTRACT

With a method whereby reactive power is changed from a fluctuating output to a constant output by a frequency rise or fall monitor circuit stage level being exceeded, and an isolated operation is detected, a problem occurs with a small scale grid in that, as the frequency is liable to fluctuate due to a load fluctuation, there is liable to be a false detection of an isolated operation. In contrast, an abnormal frequency stage detection can be performed such that the frequency at a point when the rising edge of a reactive power fluctuation is detected, and the frequency at a point when the falling edge is detected, are detected sequentially, and an abnormal frequency stage detection is recognized when the order of the difference between the current detection value and the previous detection value is "increase", "decrease", "increase".

9 Claims, 6 Drawing Sheets

ISOLATED OPERATION DETECTION DEVICE

CROSS-REFERENCE TO RELATED APPLICATION

This application claims priority under 35 U.S.C. §119 from Japanese Patent Application No. 2010-156348, filed on Jul. 9, 2010, the entirety of which is incorporated herein by reference.

BACKGROUND OF THE INVENTION

1. Technical Field

The present invention relates to a dispersed power source device with isolated operation detection function used between a power generating device used in a photovoltaic power generation system, fuel cell power generation system, wind power generation system, or the like, and a utility grid.

2. Related Art

Figure 5:
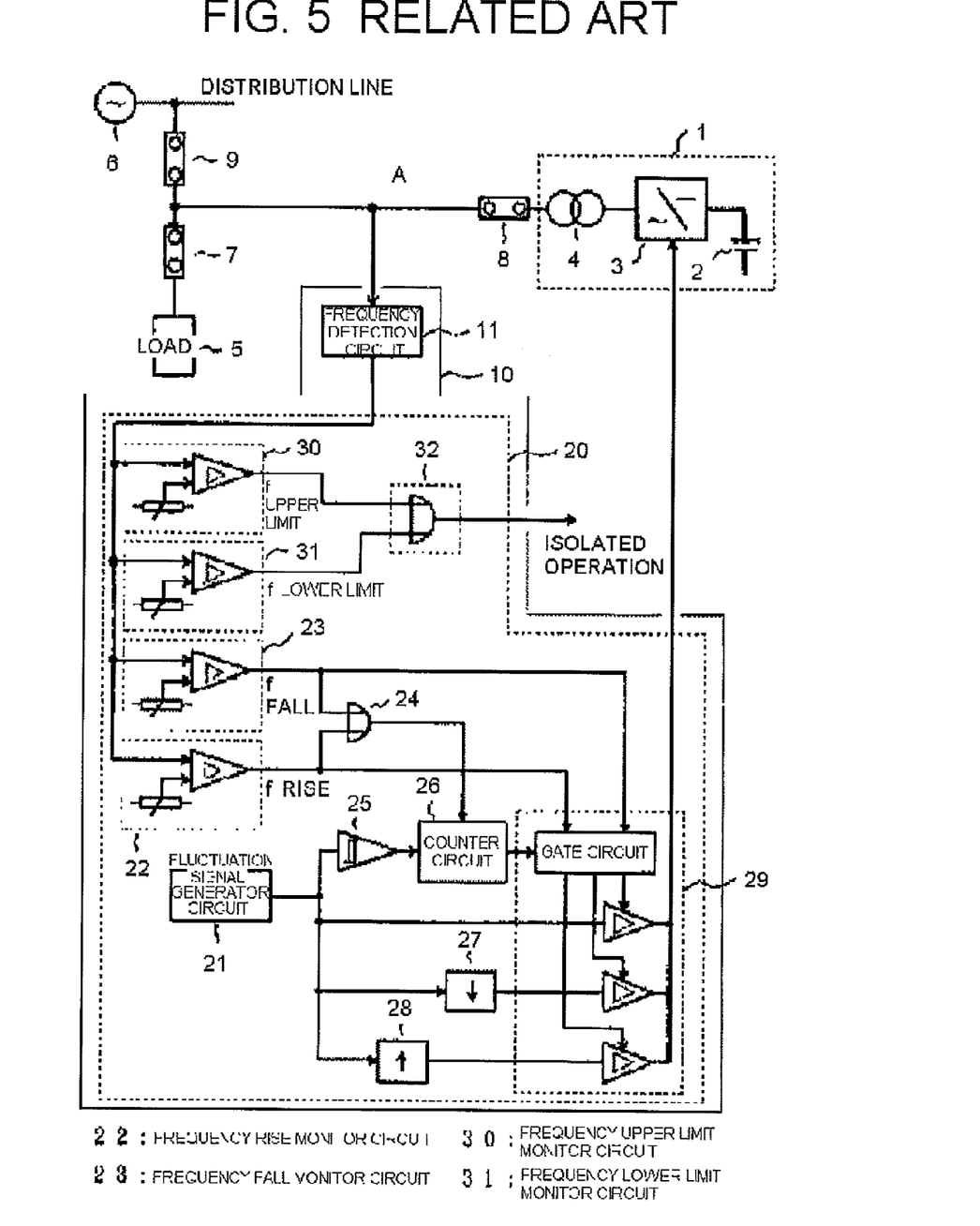
FIG. 5 is a circuit configuration diagram of a heretofore known isolated operation detection device.

FIG. 5 shows a grid interactive inverter system configuration and a heretofore known example of an isolated operation detection device. As shown in FIG. 5, a very small fluctuation is cyclically applied to the setting value of a reactive power setter included in a grid interactive inverter during grid interaction, the reactive power of a grid interaction point is constantly cyclically changed, and the frequency of the grid interaction point or grid interactive inverter is monitored.

When a very small signal of a phase advanced as seen from the grid interactive inverter is generated when a very small rise in this frequency is detected, the frequency rises further in the event of an isolated operation (also called islanding) condition. Also, when a very small signal of a phase delayed as seen from the grid interactive inverter is generated when a very small fall in the monitored frequency is detected, the frequency falls further in the event of an isolated operation condition. Focusing on this phenomenon, an isolated operation phenomenon is reliably and swiftly detected.

In FIG. 5, a fuel cell power generation system 1 is formed by or configured to include a fuel cell main body 2, a grid interactive inverter 3, and a distribution transformer 4. Reference numeral 5 refers to a load, and 6 refers to a utility grid. Also, reference numeral 7 refers to a load distribution circuit breaker, 8 refers to a dispersed power source side circuit breaker of the fuel cell power generation system 1 that acts as a dispersed power source, and 9 refers to a grid connection point circuit breaker for receiving power from the utility grid 6.

Furthermore, an isolated operation detection device 10 is formed by or configured to include a frequency detection circuit 11 formed from a frequency to voltage converter or the like, and an isolated operation detection section 20. The isolated operation detection section 20 is formed by or configured to include a fluctuation signal generator circuit 21 that generates a very small, cyclical, sinusoidal signal, a frequency rise monitor circuit 22 and frequency fall monitor circuit 23 formed from a comparator and setter that monitor a very small fluctuation in the output value of the frequency detection circuit 11, an OR circuit 24 that detects that either the frequency rise monitor circuit 22 or frequency fall monitor circuit 23 has acted, a Schmidt circuit 25 that converts the output of the fluctuation signal generator circuit 21 into a pulse waveform, a counter circuit 26 that measures the pulse waveform, a negative polarity peak hold circuit 27 as an advanced phase signal generator circuit that holds the negative polarity peak value of the output of the fluctuation signal generator circuit 21, a positive polarity peak hold circuit 28 as a delayed phase signal generator circuit that holds the positive polarity peak value of the output of the fluctuation signal generator circuit 21, a switching circuit 29 formed from an AND-OR gate circuit, three-state buffer, or the like, that applies a very small fluctuation to the setting value of reactive power setter (not shown) of the grid interactive inverter 3 by switching the signals of each of the fluctuation signal generator circuit 21, negative polarity peak hold circuit 27, and positive polarity peak hold circuit 28, and computes the signal to be selected by the output of each of the frequency rise monitor circuit 22, frequency fall monitor circuit 23, and counter circuit 26, a frequency upper limit monitor circuit 30 and frequency lower limit monitor circuit 31 formed from a comparator and setter that constantly slightly vary the reactive power of a grid connection point A, and monitor the deviation between the output of the frequency detection circuit 11 and a predetermined reference frequency, and an isolated operation signal generator circuit 32 formed from an OR gate that generates an isolated operation signal when either the frequency upper limit monitor circuit 30 or frequency lower limit monitor circuit 31 acts.

Figure 6:
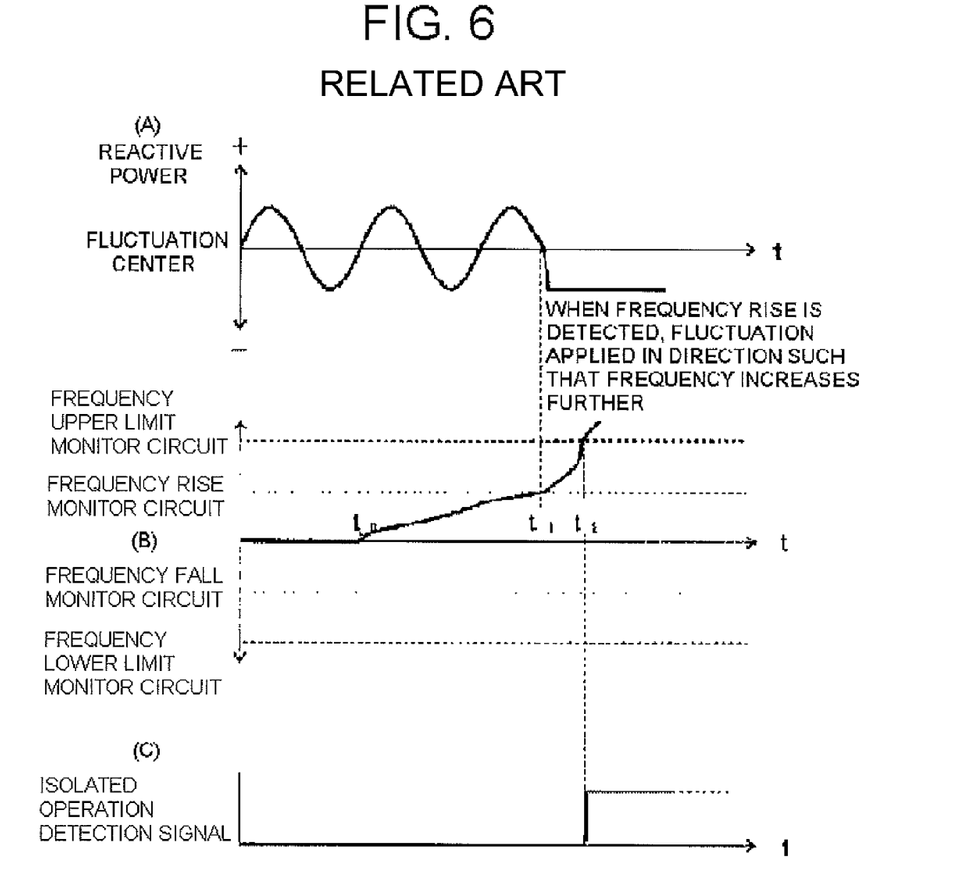
FIGS. 6A to 6C are waveform diagrams showing an action of FIG. 5.

In FIGS. 6A to 6C, when the utility grid 6 is shut off by the grid connection point circuit breaker 9 due to an accident or the like on the utility grid 6 side at a time t0 shown in FIG. 6B, in a condition in which the amount of power supplied from the grid interactive inverter 3 of the fuel cell power generation system 1 and the amount of power consumed by the load 5 are balanced, an isolated operation phenomenon occurs between the fuel cell power generation system 1 and load 5.

When this kind of condition occurs, a reactive power fluctuation is applied by the fluctuation signal generator circuit 21 and switching circuit 29, and when setting in such a way that the fuel cell power generation system 1 applies a reactive power fluctuation with a phase more delayed than the utility grid 6 when the fluctuation has positive polarity, and the fuel cell power generation system 1 applies a reactive power fluctuation with a phase more advanced than the utility grid 6 when the fluctuation has negative polarity, as shown in FIG. 6A, the kind of frequency fluctuation between the times t0 and t1 shown in FIG. 6B occurs, the frequency rise monitor circuit 22 acts at the time t1, and the waveform of the reactive power fluctuation of the grid connection point A is made the output of the negative polarity peak hold circuit 27 by the switching circuit 29 (refer to FIG. 6A).

As the frequency fluctuation at this time increases as between the times t1 and t2 shown in FIG. 6B, the frequency upper limit monitor circuit 30 acts at the time t2 shown in FIG. 6B, and an isolated operation phenomenon is detected by the isolated operation signal generator circuit 32 (refer to FIG. 6C).

As described in Japanese Patent No. 3,353,549, reactive power is changed from a fluctuating output to a constant output by a frequency rise or fall monitor circuit stage level being exceeded at a time t1. It is necessary to set this stage level at a level such that is not exceeded other than at a time of an isolated operation, even when a frequency fluctuation occurs due to a grid disturbance, but as the frequency is liable to fluctuate due to a load fluctuation with a small scale grid formed from a diesel engine utilized on a remote island, a problem occurs in that there is liable to be a false detection of an isolated operation.

SUMMARY OF THE INVENTION

Consequently, an object of the invention is to provide, in a dispersed power source having an isolated operation detection function, an isolated operation detection device that detects an abnormal frequency stage, with no false detection in a small scale grid in which frequency fluctuation due to load fluctuation is severe.

In order to achieve the object, an isolated operation detection device according to a first aspect of the invention detects an isolated operation by outputting a very small reactive power fluctuation with a normally constant cycle to the output of a grid interactive inverter acting as a dispersed power source that outputs power generated in interaction with a utility grid, outputting a constant reactive power when detecting an abnormal frequency stage after an isolated operation shift, and shifting an output frequency, the device, in order to detect the abnormal frequency stage, including a rising edge detection unit that detects a rising edge of the reactive power fluctuation, a falling edge detection unit that detects a falling edge of the reactive power fluctuation, and a frequency detection unit that detects the frequency of the output of a grid interaction point or the grid interactive inverter, wherein the frequency at a point when the rising edge of a reactive power fluctuation is detected, and the frequency at a point when the falling edge is detected, are detected sequentially, and an abnormal frequency stage detection is recognized when the order of the difference between the current detection value and the previous detection value is "increase", "decrease", "increase".

With the invention, it is possible to reduce the possibility of a false detection of a high speed frequency fluctuation by providing a time limit circuit as far as an abnormal frequency stage detection is concerned, and the effectiveness in a small scale grid in which frequency fluctuation due to load fluctuation is severe increases.

DETAILED DESCRIPTION OF THE INVENTION

A main point of the invention is that, in a dispersed power source that outputs power generated in interaction with a utility grid, a very small reactive current is output when the grid is normal, a larger constant reactive current is applied when the grid falls into a power failure condition and it is detected that the output frequency of the dispersed power source has exceeded an abnormal frequency stage detection level, and when it is determined that there is an isolated operation when the frequency reaches an isolated operation detection level, an abnormal frequency stage detection is such that the frequency at a point when the rising edge of a reactive power fluctuation is detected, and the frequency at a point when the falling edge is detected, are sequentially detected, and an abnormal frequency stage detection is recognized when the order of the difference between the current detection value and the previous detection value is "increase", "decrease", "increase".

Working Example 1

Figure 1:
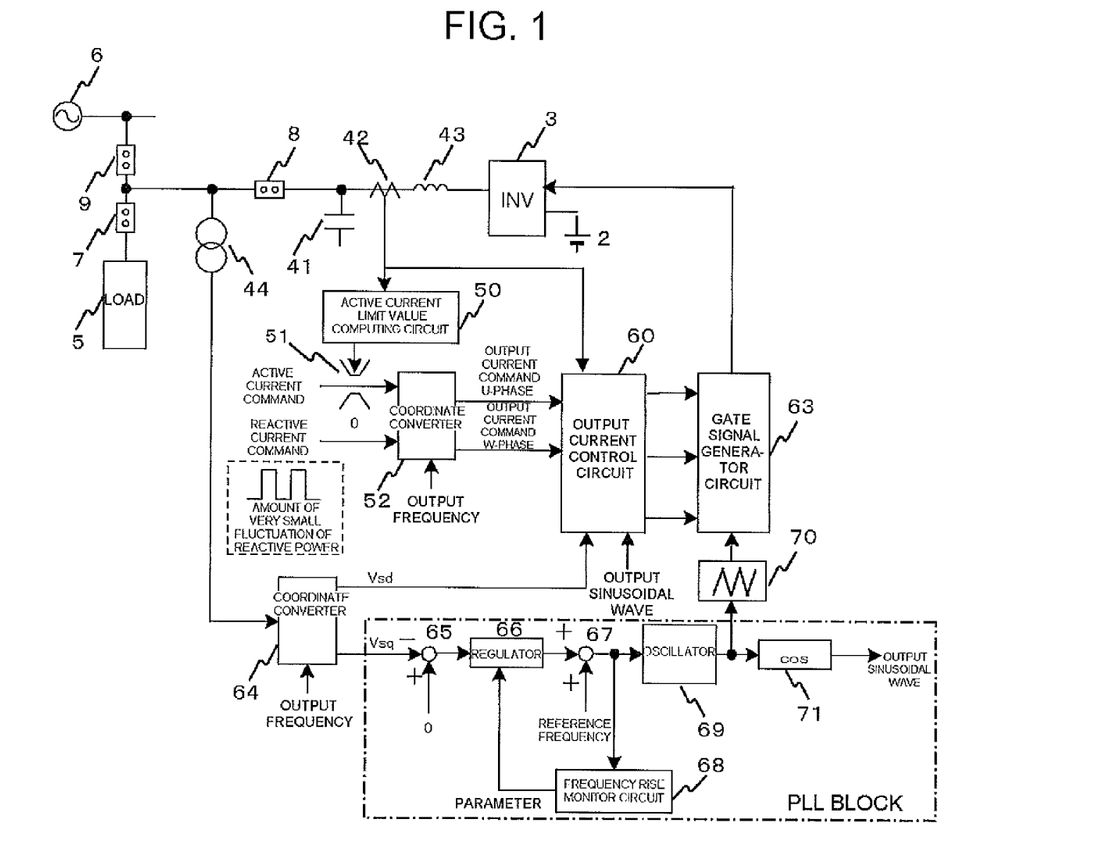
FIG. 1 shows a circuit example of a grid interactive inverter to which the invention is applied.

FIG. 1 shows a circuit example of a grid interactive inverter to which the invention is applied. A filter formed by or configured to include a reactor 43 and a capacitor 41 is connected to the output of a grid interactive inverter 3, and connected to a utility grid 6 via a dispersed power source side circuit breaker 8 and a grid connection point circuit breaker 9. Also, reference numeral 5 refers to a load, and 7 refers to a load distribution circuit breaker.

With a control device of an inverter in a dispersed power source with an isolated operation detection function, the grid side voltage of the dispersed power source side circuit breaker 8 is detected using a voltage detector 44, and the coordinates thereof are converted by an output frequency reference in a coordinate converter 64, converting the voltage into a component (Vsd) with the same phase as the grid and a component (Vsq) with a phase differing by 90°. In a PLL circuit that determines an output frequency, the deviation between the Vsq and a command value 0 is input into a regulator 66, the output thereof and a reference frequency (for example, 50 Hz or 60 Hz) are added by an adder 67, the output thereof is input into an oscillator 69, a signal equivalent to ωt is computed and input into a trigonometric function (for example, cosine) circuit 71, and the output thereof is taken as an output sinusoidal command signal of the inverter.

The Vsq is 0 in a condition in which the inverter and grid are synchronized. Furthermore, the regulator 66 is normally formed by or configured to include a PI regulator, and increases a transient response in accordance with an increase in proportional gain, a decrease in integration time, and the like, when a frequency rise monitor circuit 68 acts, and increases the amount of output of the regulator with respect to the Vsq.

Next, a method of limiting the reactive current will be shown. With this inverter, the output current is detected by a current detector 42 between the capacitor 41 and reactor 43, a limit value thereof is computed in an active current limit value computing circuit 50, and upper and lower limits are applied to an active current command value in a limit circuit 51.

Next, a reactive current command is normally of a very small value that fluctuates cyclically by the same method as described in Japanese Patent No. 3,353,549 and, after the frequency rise monitor circuit acts, becomes a constant advanced or delayed value in accordance with the changing frequency value. As the computation thereof is the same as described in Japanese Patent No. 3,353,549, a description will be omitted.

The active current command and reactive current command are input into a coordinate converter 52 that has the output frequency as a reference, and an output current command U phase and W phase are computed. The output current command U phase and W phase are input into an output current control circuit 60, where a U-phase voltage command signal, a V-phase voltage command signal, and a W-phase voltage command signal are created.

A pulse width modulation (PWM) control is carried out using the three phases of voltage command signal and a carrier signal obtained by a triangle wave carrier generator 70 from the output frequency, and an inverter gate pulse is generated by a gate signal generator circuit 63.

In a phase locked loop (PLL) block, when the reference frequency+regulator output exceeds the frequency rise level, the proportional gain of the PLL increases, and the reactive current increases. In accordance with this, the active current limit value decreases, and the frequency changes swiftly, while avoiding an overcurrent. By the rise of this frequency being detected by a frequency upper limit monitor circuit, it is possible to reliably detect an isolated operation.

Figure 2:
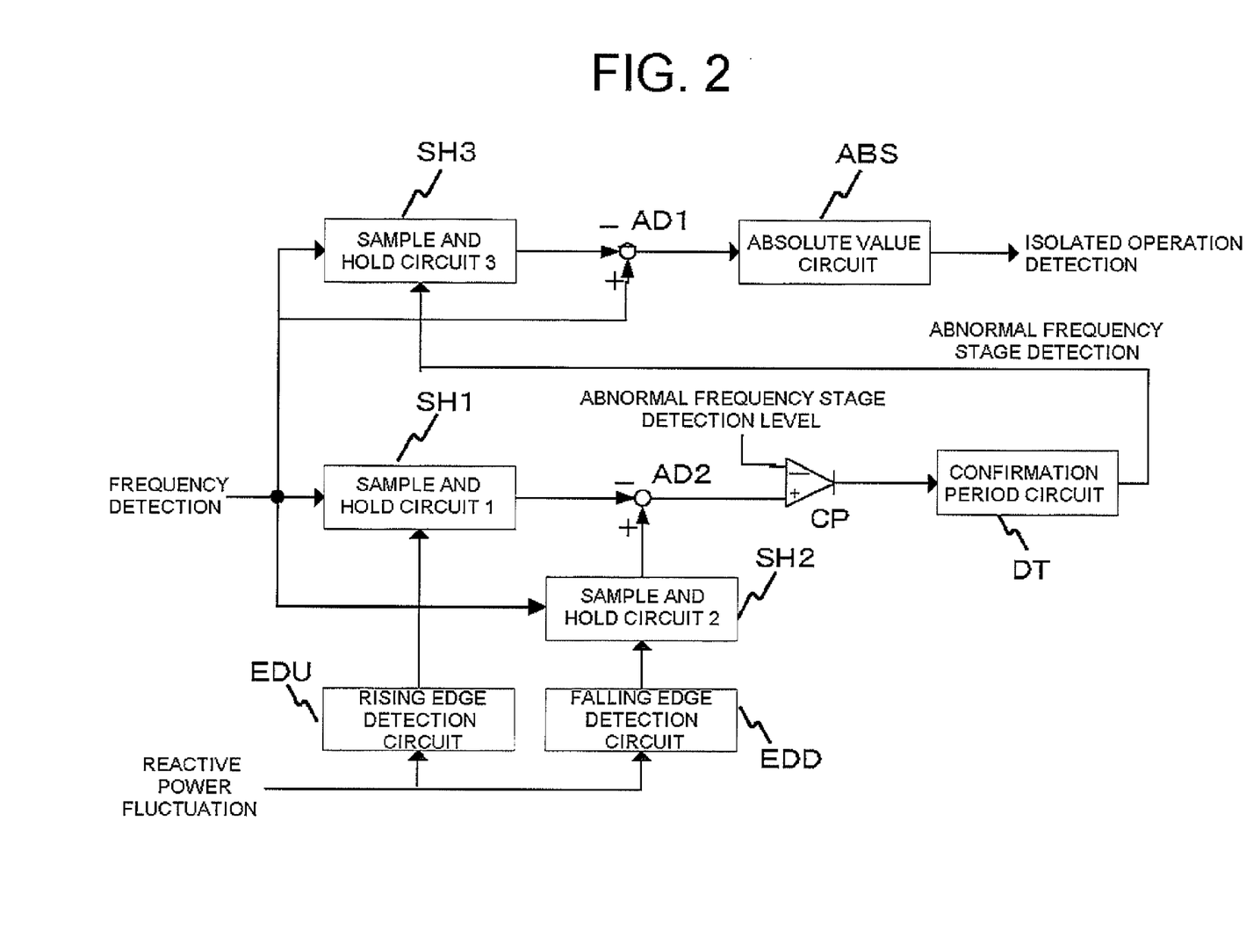
FIG. 2 is a circuit configuration diagram of an isolated operation detection device of the invention.

FIG. 2 is a circuit configuration diagram of an isolated operation detection device of the invention. The isolated operation detection device is formed by or configured to include a rising edge detection circuit EDU that detects a rising edge of a reactive power fluctuation, a falling edge detection circuit EDD that detects a falling edge, a sample and hold circuit SH1 that holds the frequency detection value at the output of the rising edge detection circuit EDU, a sample and hold circuit SH2 that holds the frequency detection value at the output of the falling edge detection circuit EDD, a subtractor AD2 that calculates the difference between the sample and hold circuits SH1 and SH2, a comparator CP that determines whether the difference in frequency has reached the abnormal frequency stage detection level, a confirmation period circuit DT that determines whether the output of the comparator CP has continued for a predetermined time, a sample and hold circuit SH3 that samples and holds the frequency at the output signal of the confirmation period circuit DT, a subtractor AD1 that computes the difference between the hold value of the sample and hold circuit SH3 and the actual frequency, and an absolute value circuit ABS that calculates the absolute value of the output of the subtractor AD1.

With this kind of configuration, an abnormal frequency stage detection is recognized only when the conditions 1 to 3 below are satisfied in response to a reactive power fluctuation and, even when the difference in the frequency detection values at the falling edge of the reactive power once exceeds the detection value, an abnormal frequency stage detection is not recognized unless the difference in the frequency detection values goes under the detection value at the next rising edge, and monitoring is started again from a falling edge.

1. The frequency exceeds the abnormal frequency stage level at a falling edge.
2. The frequency goes below the abnormal frequency stage level at a rising edge.
3. The frequency exceeds the abnormal frequency stage level again at a falling edge.

Figure 3:
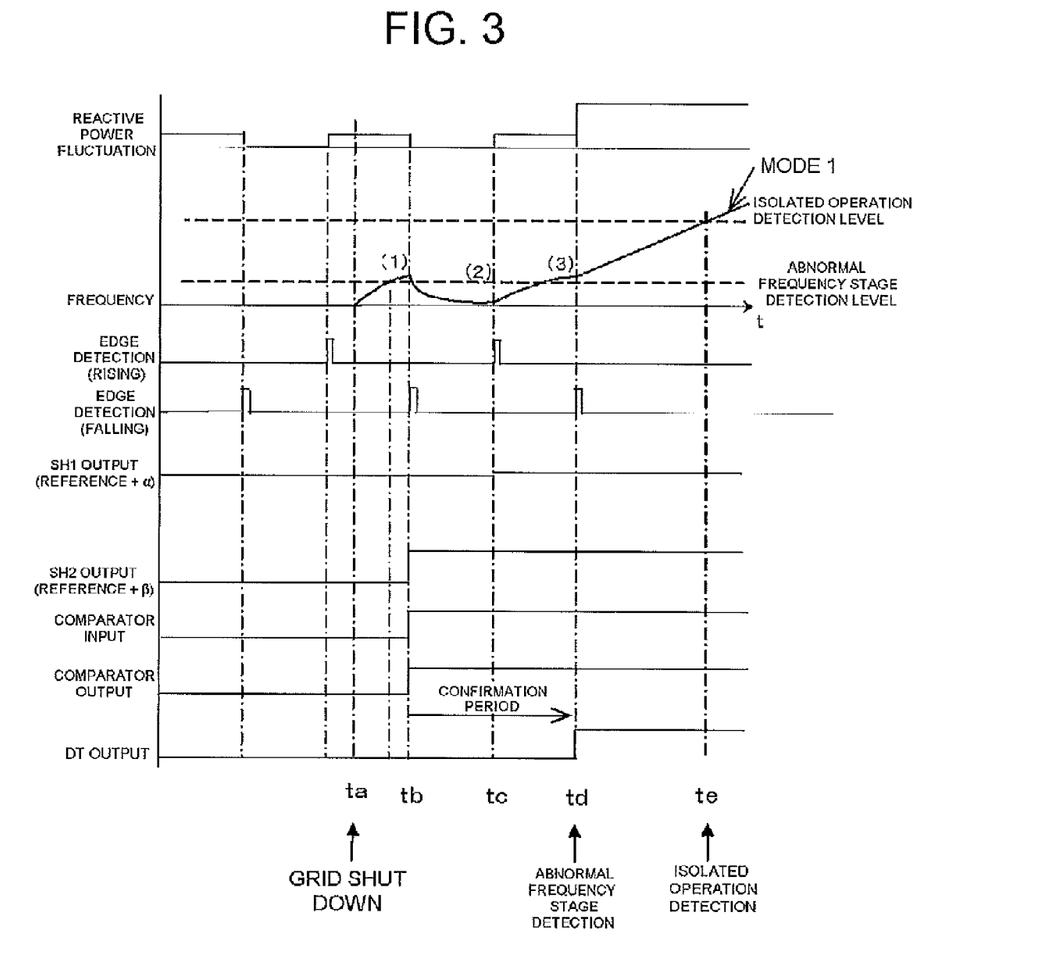
FIG. 3 is a waveform diagram showing a first action of FIG. 2.
Figure 4:
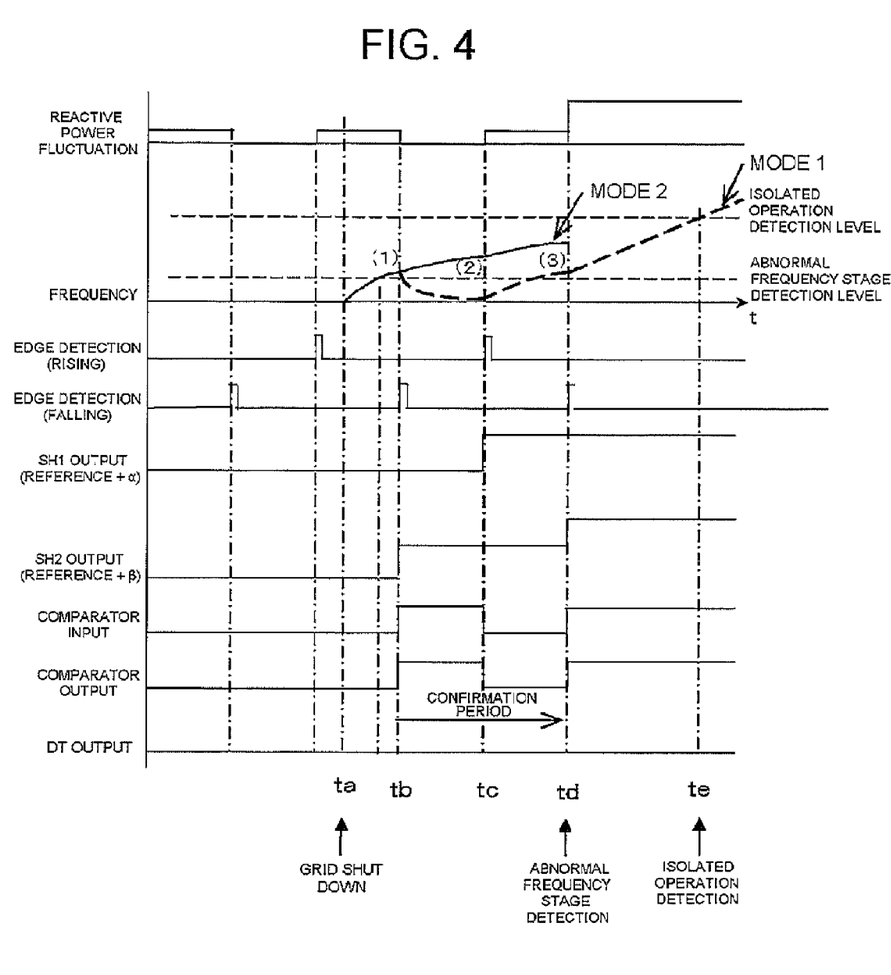
FIG. 4 is a waveform diagram showing a second action of FIG. 2.

FIGS. 3 and 4 are operational waveform diagrams corresponding to FIG. 2.

FIG. 3 is an operational mode operational waveform diagram corresponding to detecting an isolated operation based on the principle of the invention, and FIG. 4 is an operational mode operational waveform diagram corresponding to not detecting an isolated operation on the principle of the invention.

In FIG. 3, when the grid is shut down at a time ta, the frequency rises in response to the fluctuation of the reactive power, the SH2 output—the SH1 output exceeds the abnormal frequency stage detection level at a time tb, and the output of the comparator CP becomes high (H). Subsequently, when the output of the comparator CP continues to be high (H) for longer than the time set in the confirmation period circuit DT (one cycle or more of the reactive power fluctuation), the output of the confirmation period circuit DT becomes high (H) at a time td. The sample and hold circuit SH3 is caused to act by this signal, the reactive power fluctuation is shifted to a constant value at the same time as the frequency is held, and the frequency fluctuation is further increased. As a result of this, the difference between the hold value and the actual frequency at a time to exceeds the isolated operation detection level, and an isolated operation detection signal is output. In this way, an abnormal frequency stage is detected when the frequency increases in the period between the times ta and tb, decreases in the period between the times tb and tc, and increases in the period between the times tc and td, after which, an isolated operation is detected.

FIG. 4 shows an action when the frequency fluctuation increases in the period between the times ta and tb, increases in the period between the times tb and tc, and increases in the period between the times tc and td. When the grid is shut down at the time ta, the frequency rises in response to the fluctuation of the reactive power, the SH2 output—the SH1 output exceeds the abnormal frequency stage detection level at the time tb, and the output of the comparator CP becomes high (H). Next, when the frequency increases until the point of the time tc, the SH1 output becomes larger than the SH2 output at the point of the time tc, and the output of the comparator CP becomes low (L). Furthermore, even when the frequency continues to rise, the confirmation period circuit DT does not act at the time td, no abnormal frequency stage is detected, and no isolated operation is detected either.

As heretofore described, an abnormal frequency stage detection is recognized only when the conditions 1 to 3 above are satisfied in response to a reactive power fluctuation and, even when the difference in the frequency detection values at the falling edge of the reactive power once exceeds the detection value, an abnormal frequency stage detection is not recognized unless the difference in the frequency detection values goes under the detection value at the next rising edge, and monitoring is started again from a falling edge.

After an abnormal frequency stage detection level is detected, a constant advanced or delayed reactive power value is output in accordance with the changing frequency value. This calculation method is the same as that in Japanese Patent No. 3,353,549.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:

1. An isolated operation detection device that detects an isolated operation by outputting a very small reactive power fluctuation with a normally constant cycle to an output of a grid interactive inverter acting as a dispersed power source that outputs power generated in interaction with a utility grid, outputting a constant reactive power when detecting an abnormal frequency stage after an isolated operation shift, and shifting an output frequency, the device, in order to detect an abnormal frequency stage, comprising:
  a rising edge detection unit that detects a rising edge of the reactive power fluctuation;
  a falling edge detection unit that detects a falling edge of the reactive power fluctuation; and
  a frequency detection unit that detects a frequency of an output of a grid interaction point or the grid interactive inverter, wherein
  the frequency at a point when the rising edge of a reactive power fluctuation is detected, and the frequency at a point when the falling edge is detected, are detected sequentially, and an abnormal frequency stage detection is recognized when an order of a difference between sequentially detected frequencies is an increase in frequency, followed by a decrease in frequency, followed by an increase in frequency.

2. The isolated operation detection device of claim 1, wherein the frequency exceeds an abnormal frequency stage level at the falling edge, and the frequency goes below the abnormal frequency stage level at the rising edge.

3. The isolated operation detection device of claim 1, wherein the abnormal frequency stage detection is recognized based on detecting the frequency exceeding an abnormal frequency stage level at the falling edge, then detecting that the frequency goes below the abnormal frequency stage level at the rising edge, and then again detecting that the frequency exceeds the abnormal frequency stage level at the falling edge.

4. A system comprising:
a rising edge detection unit configured to detect a rising edge of a reactive power fluctuation;
a falling edge detection unit configured to detect a falling edge of the reactive power fluctuation; and
a frequency detection unit configured to detect a frequency corresponding to a grid interaction point or grid interactive inverter; wherein
the frequency detection unit is configured to recognize an abnormal frequency stage based on detecting a predetermined sequence of an increase, followed by a decrease, followed by an increase in the frequency corresponding to the grid interaction point or grid interactive inverter, at times corresponding respectively to the rising edge and the falling edge.

5. The system of claim 4, wherein each increase corresponds respectively to a falling edge, and the decrease corresponds to a rising edge.

6. The system of claim 5, wherein the frequency exceeds the abnormal frequency stage level at each falling edge, and the frequency goes below the abnormal frequency stage level at the rising edge.

7. A method, comprising:
detecting a rising edge of a reactive power fluctuation;
detecting a falling edge of the reactive power fluctuation; and
monitoring a frequency corresponding to a grid interaction point or grid interactive inverter; and
recognizing an abnormal frequency stage associated with the monitored frequency based on detecting a predetermined sequence of an increase, followed by a decrease, followed by an increase in the monitored frequency.

8. The method of claim 7, further including detecting each increase during a time corresponding to the falling edge in a reactive power fluctuation associated with the grid interaction point or grid interactive inverter, and detecting the decrease during a time corresponding to the rising edge in the reactive power fluctuation associated with the grid interaction point or grid interactive inverter.

9. The method of claim 7, the recognizing including detecting that the monitored frequency exceeds an abnormal frequency stage level at a falling edge in a reactive power fluctuation associated with the grid interaction point or grid interactive inverter, then detecting that the monitored frequency goes below the abnormal frequency stage level at a rising edge in the reactive power fluctuation associated with the grid interaction point or grid interactive inverter, and then again detecting that the monitored frequency exceeds the abnormal frequency stage level at the falling edge in the reactive power fluctuation associated with the grid interaction point or grid interactive inverter.

* * * * *